US012288757B2

(12) United States Patent
Öjefors et al.

(10) Patent No.: US 12,288,757 B2
(45) Date of Patent: Apr. 29, 2025

(54) ARRANGEMENT COMPRISING AN INTEGRATED CIRCUIT PACKAGE AND A HEATSINK ELEMENT

(71) Applicant: Sivers Wireless AB, Kista (SE)

(72) Inventors: Erik Öjefors, Kista (SE); Dragos Dancila, Uppsala (SE); Imran Aziz, District Gujrat (PK); Johanna Hanning, Kista (SE)

(73) Assignee: Sivers Wireless AB (SE)

( * ) Notice: Subject to any disclaimer, the term of this patent is extended or adjusted under 35 U.S.C. 154(b) by 661 days.

(21) Appl. No.: 17/570,948

(22) Filed: Jan. 7, 2022

(65) Prior Publication Data

US 2022/0216166 A1     Jul. 7, 2022

(30) Foreign Application Priority Data

Jan. 7, 2021 (EP) .................................. 21150555

(51) Int. Cl.
| | |
|---|---|
| H01L 23/66 | (2006.01) |
| H01L 21/48 | (2006.01) |
| H01L 23/00 | (2006.01) |
| H01L 23/367 | (2006.01) |
| H01L 23/498 | (2006.01) |
| H01L 23/538 | (2006.01) |
| H01Q 1/22 | (2006.01) |

(52) U.S. Cl.
CPC .......... *H01L 23/66* (2013.01); *H01L 21/4871* (2013.01); *H01L 23/367* (2013.01); *H01L 23/49816* (2013.01); *H01L 23/538* (2013.01); *H01L 24/20* (2013.01); *H01Q 1/2283* (2013.01); *H01L 2223/6677* (2013.01)

(58) Field of Classification Search
CPC ... H01L 23/66; H01L 21/4871; H01L 23/367; H01L 23/49816; H01L 23/538; H01L 24/20; H01L 2223/6677; H01L 23/4006; H01L 23/3128; H01Q 1/2283; H01Q 13/02; H01Q 1/02; H01Q 9/16; H01Q 1/002
See application file for complete search history.

(56) References Cited

U.S. PATENT DOCUMENTS

| | | | |
|---|---|---|---|
| 6,885,557 B2 * | 4/2005 | Unrein | ................ H01L 23/4006 248/510 |
| 9,583,811 B2 | 2/2017 | Seler et al. | |
| 9,743,558 B2 * | 8/2017 | Bosak | ................... H01L 23/473 |
| 2014/0110841 A1 | 4/2014 | Beer et al. | |

(Continued)

*Primary Examiner* — Seung H Lee
(74) *Attorney, Agent, or Firm* — Condo Roccia Koptiw LLP

(57) ABSTRACT

An arrangement (100) is provided. The arrangement comprises an integrated circuit package (2). The integrated circuit package comprises a first side (2a) which comprises interconnect elements, and a second side (2b) which is opposite to the first side (2a). The integrated circuit package further comprises at least one antenna element (25), and a heatsink element (1) arranged on the second side (2b) of the integrated circuit package (2). The heat sink element comprises at least one passage (10). The at least one passage (10) extends through the heatsink element (1). A first opening (13) of the at least one passage (10) is arranged at a respective antenna element (25) of the at least one antenna element. The at least one passage (10) is configured to increase the gain of the respective antenna element (25).

20 Claims, 5 Drawing Sheets

(56) References Cited

U.S. PATENT DOCUMENTS

| | | | |
|---|---|---|---|
| 2018/0218986 A1* | 8/2018 | Kamgaing | H01L 25/0657 |
| 2019/0355680 A1 | 11/2019 | Chuang et al. | |
| 2020/0251414 A1 | 8/2020 | Hsu et al. | |
| 2021/0183797 A1* | 6/2021 | Vincent | H01P 11/002 |

* cited by examiner

ARRANGEMENT COMPRISING AN INTEGRATED CIRCUIT PACKAGE AND A HEATSINK ELEMENT

CROSS REFERENCE TO RELATED APPLICATIONS

This application claims priority from EP application Ser. No. 21/150,555.7, filed Jan. 7, 2021, the entire contents of which are hereby incorporated by reference herein.

FIELD OF THE INVENTION

The present invention is generally related to antenna elements and cooling of an integrated circuit comprising said antenna elements.

BACKGROUND OF THE INVENTION

The use of smart devices is increasing exponentially, and smart devices often need to be able to transmit and to receive signals via a wireless communication link. Further, the advent of 5G has increased, and continues to increase, the use of antennas operating within the 1 to 30 GHz spectrum. Therefore, the use of millimeter wave antennas is rapidly increasing. Some solutions use antennas integrated with an integrated circuit chip. The integrated circuit chip may, for example, be a radio frequency chip using integrated fan-out wafer level packaging (InFO-WLP) technology, or similar packing technologies. The transmission lines of such solutions typically use a rectangular waveguide to transmit and/or receive signal to/from antennas of an integrated circuit package. A main driver for the combination of InFO-WLP and integrated antennas has been the reduced signal loss between the chip and the antenna feeding line. A problem of the current technology is its large form factor package and the need to cool the integrated circuit. Additionally, there is an interest to provide steering ability of the antenna. However, heatsinks increase the form factor of a device and/or disturb and/or block antennas of a device. Thereby, heatsinks often reduce the performance of antennas of a device.

U.S. Pat. No. 9,583,811 B2 discloses a microwave device including a semiconductor package comprising a microwave semiconductor chip and a wave-guide part associated with the semiconductor package.

SUMMARY OF THE INVENTION

It is of interest to provide an integrated circuit package comprising at least one antenna element, which has a small form factor, while still providing a good antenna performance. Additionally, it is of interest to provide the ability of cooling the integrated circuit without disturbing and/or blocking the at least one antenna element.

These interests are met by providing an arrangement having the features in the independent claims. Preferred embodiments are defined in the dependent claims.

Hence, according to an aspect of the present invention, there is provided an arrangement comprising an integrated circuit package. The integrated circuit package may comprise a first side comprising interconnect elements, and a second side which is opposite to the first side. Further, the integrated circuit package may comprise at least one antenna element. The arrangement may comprise a heatsink element. The heatsink element may be arranged on the second side of the integrated circuit package. The heatsink element may comprise at least one passage. The at least one passage may extend through the heatsink element. A first opening of the at least one passage may be arranged at a respective antenna element of the at least one antenna element. The at least one passage may be configured to increase the gain of the respective antenna element.

According to an aspect of the present invention, there is provided a heatsink element. The heatsink element may be configured to be arranged on an integrated circuit package. The heatsink element may comprise at least one passage. The passage may extend through the heatsink element. The integrated circuit package may comprise at least one antenna element. A first opening of each passage may be configured to be arranged at a respective antenna element of the at least one antenna element. The at least one passage may be configured to increase the gain of the at least one antenna element of the integrated circuit package. The size of the heatsink element may be increased, thereby increasing the cooling properties, while maintaining a size(s) of the at least one passage. The heatsink element may be connected to an auxiliary heatsink, thereby providing better cooling properties.

According to an aspect of the present invention, there is provided a system. The system may comprise an arrangement according to another aspect of the invention. The system may further comprise a printed circuit board. The arrangement may be mounted to and/or on the printed circuit board. The arrangement may be soldered to the printed circuit board. The arrangement may offer a compact solution with a small footprint on the printed circuit board.

The integrated circuit package may comprise an embedded wafer level ball grid array package, eWLB package. The integrated circuit package may comprise a die and a mold compound. By the term "die", it is meant, for example, chip or chipset. The die may comprise a transceiver chip. The integrated circuit package may comprise at least one mold compound layer. The integrated circuit package may comprise at least one dielectric layer. The at least one dielectric layer may be thinner than the at least one mold compound layer. The integrated circuit package may comprise at least one redistribution metal layer. The at least one dielectric layer may be arranged between at least two redistribution metal layers. The die and/or the interconnect elements may be arranged at the dielectric layer. The at least two redistribution metal layers may be arranged to connect the die and the interconnect elements. The integrated circuit package may comprise a radio frequency integrated circuit, RFIC. The RFIC may be configured for 5G communication. The RFIC may be a 5G RFIC. The RFIC may be preferably be a 20-45 GHz RFIC, more preferably a 24.25-29.5 GHz RFIC or a 37.0-43.5 GHz RFIC, or most preferably a 28 GHz RFIC or a 39 GHz RFIC. The arrangement may be configured for custom premises equipment, CPE. The arrangement may be configured for a fixed wireless access link. The wireless access link may be at, for example, 20-45 GHz, 24.25-29.5 GHz, 37.0 GHz-43.5 GHz, or 28 GHz, and/or 39 GHz. The at least one metal layer may be accessed via the interconnect elements.

The interconnect elements may comprise solder bumps. The solder bumps may be configured to connect to the metal layers of the integrated circuit package. Further, the solder bumps may be configured to be soldered to a printed circuit board. The solder bumps may comprise signal bumps and/or ground bumps. Additionally, the solder bumps may comprise stud bumps and/or dummy bumps, which may be configured to support the integrated circuit package when the integrated circuit package is mounted/soldered to a printed circuit board.

The at least one antenna element may be arranged in the integrated circuit package. The at least one antenna element may comprise at least one antenna-in-package. In other words, by the term "at least one antenna element arranged in the in the integrated circuit package" it is meant, for example, "at least one antenna-in-package". The at least one antenna element may be understood as, for example, at least one antenna array. An antenna element of the at least antenna element may comprise a plurality of antennas. Further, an antenna element of the at least antenna element may comprise an antenna array. A plurality of antennas may comprise any number of antennas, such as, for example, two, three, four, five, six, seven, eight, or more. For example, each antenna element may comprise an antenna array, wherein each antenna array may comprise a, for example, 1×2-8, 2×2-8, 3×2-8, 4×2-8, antenna array. The integrated circuit package may comprise at least one resonator strip connected to ground. The at least one resonator strip may be arranged between two antenna elements and/or antennas. The at least one resonator strip may be configured for decoupling antennas and/or antenna elements. The at least one antenna elements may be arranged in a plane.

The at least one antenna element may be arranged in a fan-out area of the integrated circuit package. The fan-out area may be understood as a part of the integrated circuit package comprising mold compound. The fan-out area may be understood as a part of the mold compound comprising at least one antenna element. The fan-out area may be understood as a part of the integrated circuit package not comprising the die. The die may have a smaller size than a size of the integrated circuit package. The mold compound may be arranged over the die as well. A thickness of the mold compound at a fan-out area may be greater than a thickness of the mold compound at the die. The die may be arranged substantially at the center of the integrated circuit package. Consequently, the fan-out area may be arranged around the die. In other words, the fan-out area may be arranged between the die and sides of the integrated circuit package. The at least one antenna element may be arranged between the mold compound and the dielectric layer. The at least one antenna element may be arranged in a redistribution layer.

An at least one antenna element arranged in a fan-out area of the integrated circuit package may realize electromagnetic coupling from the fan-out area of the integrated circuit to the heatsink element, thereby no (expensive) radiofrequency substrate may be needed.

The at least one antenna element may comprise at least one dipole antenna. Each leg of the at least one dipole antenna may be fed at a center of the at least one dipole antenna. Each leg may be fed with separate signal lines from the integrated circuit. Thereby, the phase and amplitude of a signal to each leg can be controlled individually which allows implementing the required differential phase shift. The required differential phase shift may be 180 degrees. The differential phase shift may be implemented without requiring baluns and/or other passive phase shifting components.

The integrated circuit package may comprise at least two antenna elements. The integrated circuit package may comprise at least two dipole antennas. There may be open-ended resonator strips arranged between the at least two antenna elements and/or at least two dipole antennas. The resonator strips may be connected to ground. A resonator strip may be configured to decouple antenna elements and/or dipole antennas which are adjacent to said resonator strip. Each of the at least two antenna elements may be arranged on a respective side of the integrated circuit package. For example, a first antenna element may be arranged on a left-hand side of the integrated circuit package, as seen from above, and a second antenna element may be arranged on a right-hand side of the integrated circuit package, as seen from above. It is to be understood, that the integrated circuit package is not limited to comprising a first antenna element and a second antenna element. The integrated circuit package may comprise any number of antenna elements, such as, for example, three, four, five, six, or more. Further, it is to be noted that by the term "antenna element" it is meant, for example, an antenna array. An antenna array may comprise any number of antennas, such as, for example, one, two, three, four, five, six, seven, eight, or more. Additionally, two antenna arrays may comprise different or equal number of antennas. As an example, the at least one antenna element may comprise two antenna arrays, wherein the two antenna arrays may comprise an equal or different number of antennas. By using at least two antenna elements, a higher gain may be acquired.

At least one of the at least two antenna elements may be a receiving antenna element. At least one of the at least two antenna elements may be a transmitting antenna element. The arrangement may be configured to receive all signals via one of the at least two antenna elements. The arrangement may be configured to transmit all signals via one of the at least two antenna elements. The integrated circuit package may comprise a plurality of antenna elements. For example, the integrated circuit package may comprise one, two, three, four, five, six, or more, antenna elements. The arrangement may be configured to receive all signals via any number of the antenna elements, and to transmit all signals via the remaining antenna elements. Further, the integrated circuit package may comprise antenna elements configured to transmit and receive signals. The integrated circuit package may comprise at least one transmitting antenna element, at least one receiving antenna element and at least one antenna element configured to transmit and to receive signals. Using (a) dedicated antenna element(s) for receiving signals and (a) dedicated antenna element(s) for transmitting signals may increase the efficiency of the arrangement.

At least one of the two antenna elements may be arranged in a first fan-out area of the integrated circuit package. At least one of the two antenna elements may be arranged in a second fan-out area of the integrated circuit package. The first fan-out area may be separate from the second fan-out area. The fan-out area may comprise the first fan-out area and the second fan-out area. Further, the fan-out area may comprise any number of fan-out areas, such as, for example, one, two, three, four, five, six, or more. A first fan-out area may be arranged between a first side of the die and a first side of the integrated circuit package. A second fan-out area may be arranged between a second side of the die and a second side of the integrated circuit package. The first side of the die may be arranged opposite to the second side of the die. The first side of the integrated circuit package may be arranged opposite to second side of the integrated circuit package. An area, or areas, of the fan-out area arranged between the first fan-out area and the second fan-out area, may comprise signal and/or ground routing. The signal and/or ground routing may be configured to reduce mutual coupling between antenna elements.

The at least one antenna element arranged in a first fan-out area may be a receiving antenna element. The at least one antenna element arranged in a second fan-out area may be a transmitting antenna element. Each antenna element arranged in a first fan-out area may be a receiving antenna element. Each antenna element arranged in a second fan-out area may be a transmitting antenna element. A passage of the heatsink element arranged at the first fan-out area, comprising the receiving antenna element, may be understood as a passage for receiving signals. A passage of the heatsink element arranged at the second fan-out area, comprising the transmitting antenna element, may be understood as a passage for transmitting signals. Arranging (a) receiving antenna element(s) and (a) transmitting antenna element(s) in different fan-out areas may increase decoupling, decrease disturbance, and/or increase the performance of the at least two antenna elements. The heatsink element may be arranged between the first fan-out area and the second fan-out area, which may further increase decoupling, decrease disturbance, and/or increase the performance of the at least two antenna elements.

The at least one passage may be configured as a horn antenna. The at least one passage may be configured as a waveguide horn. A shape of the passage may be understood as, for example, a shape of an antenna horn, and/or a shape of a waveguide horn. Openings of the passage may be understood as, for example, openings of a horn antenna, and/or openings of a waveguide horn. Each passage may be arranged at a respective antenna element. By the term "respective", it is meant, for example, one corresponding, one respective, and/or one interrelated. The first opening of each passage may be arranged at a respective antenna element. It is to be noted that the respective antenna element may comprise a plurality of antennas and/or antenna arrays. The first opening may have a width substantially equal to a width of the respective antenna element. The first opening may have a length substantially equal to a length of the respective antenna element. The length and the width of the antenna element may be parallel to the first side and the second side of the integrated circuit package, respectively. Further, the length and/or the width of an antenna element may be understood as a length and/or width of a rectangle, wherein the rectangle is the smallest rectangle which could surround or encompass the antenna element. The passage may comprise a plurality of passage sides. For example, the passage may comprise four passage sides. Each passage side may be arranged along a plane, wherein the plane may be arranged at an angle in relation to a plane in which the first opening is arranged. The plane(s) may be tilted outward from the first opening. Opposite planes may be tilted at angles of equal value. Opposite planes may be tilted at angles of equal value, but in opposite directions. A first pair of opposite planes may be tilted at a first angle, and a second pair of opposite planes may be tilted at a second angle. The first angle may be greater than the second angle.

A heatsink element comprising at least one passage, wherein said at least one passage is configured to be arranged at a respective antenna element, may have a reduced form factor. Said heatsink element may be arranged at a side, or surface, of an integrated circuit package, comprising said at least one antenna element, such that said heatsink element is contact with a larger portion of said side, or surface, than other kinds of heatsink elements. By being in contact with a larger portion of said side, or surface, the form factor of the heatsink element may be reduced, while still providing a high cooling ability. The ability to be in contact with a larger portion of said side, or surface, is due to the at least one passage of said heatsink element. The at least one passage may be configured to increase the gain of the respective at least one antenna element. The at least one passage may be configured as a horn antenna for the respective at least one antenna element. Other kinds of heatsink elements may only contact a small portion of an integrated circuit chip, in order to not block or disturb antenna elements of the integrated circuit chip. Therefore, in order to provide enough cooling capability, other kinds of heatsink may need to comprise pins, and/or fins, which may need a lot of space. Additionally, other kinds of heatsink elements may be placed to minimize disturbing or blocking antenna elements. Said heatsink element may instead increase the performance of the at least one antenna elements. Said heatsink element may increase the performance of the at least one antenna element, while still providing a high cooling ability. Further, said heatsink element may have a reduced form factor, while providing a high cooling ability. The increased antenna performance provided by the at least one passage of said heatsink element may be further increased by matching a shape of the at least one passage to the at least one antenna element.

The heatsink element may comprise a top and a bottom. The first opening of each passage may be arranged at the bottom of the heatsink element. A second opening of each passage may be arranged at least in part at the top of the heatsink element. The second opening of each passage may be arranged at least in part at a side of the heatsink element. The second opening may be larger than the first opening. The second opening of each passage may be arranged at the top of the heatsink element. The sides of a passage may extend from the first opening to the second opening. The second opening may comprise a width and a length. The length of the second opening may be greater than the width of the second opening. The first angle may define the length of the second opening. The second angle may define the length of the second opening. The second angle may define whether the second opening is arranged completely at the top of the heatsink element or if the second opening is arranged in part at the top and in part at the sides of the heatsink element. The second openings of the passages may extend in a direction, wherein the direction is substantially parallel to the length of a body of the heatsink, along the entire length of the body of the heatsink element. Thereby, the second openings may divide the top of the heatsink into a number of sections. The number of sections may be equal to the number for passages plus one. The number of sections may comprise two side sections. Further, the number of sections may comprise at least one middle section. A "middle section" may be understood as, for example, a ridge. The heatsink element may comprise metal. The metal may be a metal with a high heat transfer capability.

The heatsink element may be arranged in contact with the second side of the integrated circuit package. The heatsink element be arranged in contact with, substantially, the entire die along the second side of the integrated circuit package. A middle section of the heatsink element may be in contact with the die. The heatsink element may be configured for thermal transport. The heatsink element may be configured for thermal transport of dissipated power and/or heat of the integrated circuit package.

The printed circuit board may comprise at least one reflector element. The arrangement may be arranged at the at least one reflector element. Each reflector element may be arranged at a respective antenna element. The at least one reflector element may comprise a metal layer. The metal layer may be arranged at a quarter wave distance from the at least one antenna element. By the term "a quarter wave distance", it is meant, for example, a distance substantially equal to a fourth of the wavelength of the signals transmitted and/or received by the at least one antenna element. The metal layer may comprise a metallized backside of the printed circuit board. Each of the at least one reflector element may comprise vias. The vias may be arranged around the respective antenna element. The vias may be arranged along the edges of a rectangle, wherein the rectangle is the smallest rectangle which could surround or encompass the respective antenna element. The arrangement and the printed circuit board may be respectively arranged such that the vias and the respective antenna element align. By the term "vias", it is meant, for example, fencing.

BRIEF DESCRIPTION OF THE DRAWINGS

This and other aspects of the present invention will now be described in more detail, with reference to the appended drawings showing embodiment(s) of the invention.

DETAILED DESCRIPTION

Figure 1:
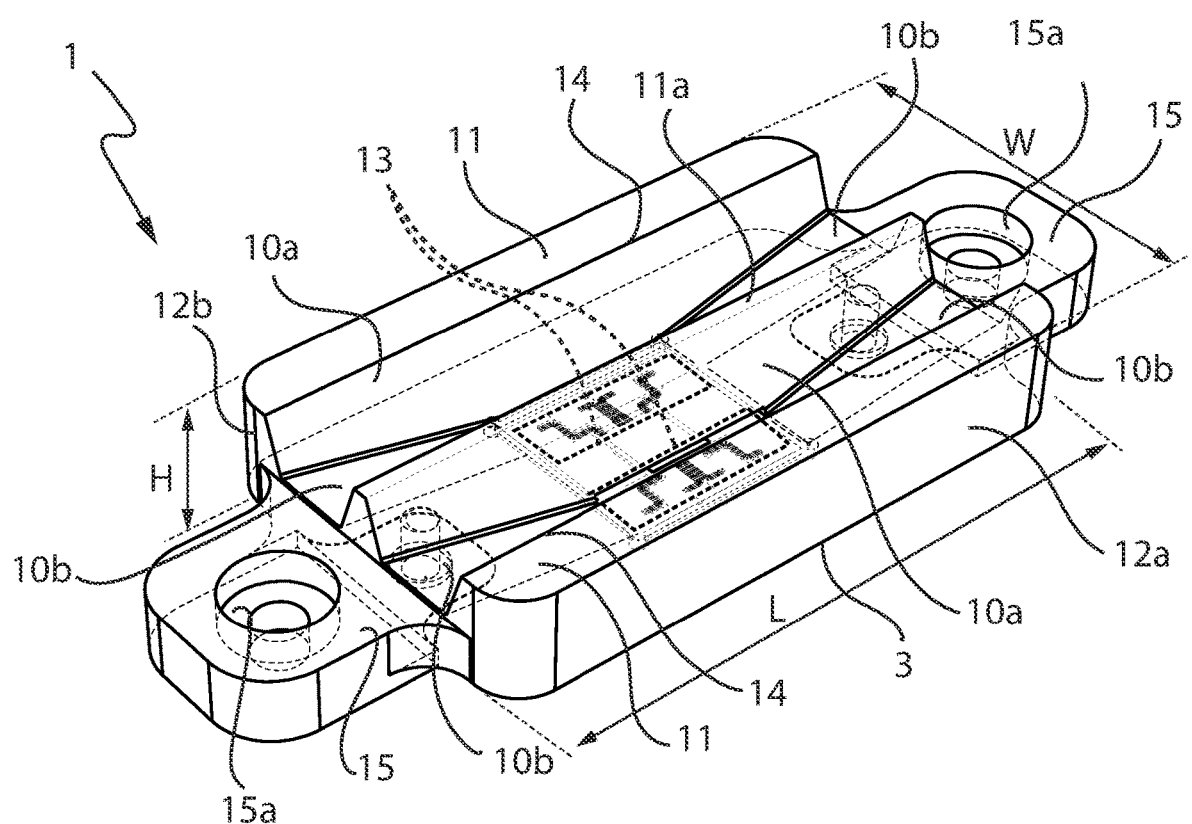
FIG. 1 schematically shows a heatsink element according to an exemplifying embodiment of the present invention.

FIG. 1 shows a heatsink element 1 according to an exemplifying embodiment of the present invention. The heatsink element 1 comprises a body. The body has a length, a width and a height. The length of the body is in a direction of an axis L. The width of the body is in a direction of an axis W. The height of the body is in a direction of an axis H. The axes L, W, and H are perpendicular to each other. The length of the body is greater than the width of the body. The width of the body is greater than the height of the body. The body has a top 11, 11a, a bottom 3, and four sides 12a, 12b. The body has a substantially rectangular cuboid shape. The top 11, 11a, the bottom 3, and the four sides 12a, 12b may be understood as the sides of the rectangular cuboid shape. The corners between the sides 12a, 12b are rounded. The corners between the sides 12a, 12b, the top 11, 11a and the bottom 3 have an angle of substantially 90 degrees. The four sides 12a, 12b comprise two first sides 12a and two second sides 12b. The two first sides 12a are opposite to each other. The two second sides 12b are opposite to each other. The first sides 12a are longer than the second sides 12b. The first sides 12a and the second sides 12b have a substantially equal height. The present invention is not limited to a heatsink element 1 having a rectangular cuboid shape. For example, the heatsink element may have substantially any geometrical shape. A shape of passages 10, see FIG. 3, of the heatsink element 1 may be maintained regardless of the shape of the body of the heatsink element 1.

The heatsink element 1 comprises two attachment members 15. Each attachment member 15 has a rectangular cuboid shape. The attachment members 15 are attached to the body. The attachment members 15 are attached at the second sides 12b. A width of the attachment members 15 is lesser than the width of the body. A height of the attachment members 15 is lesser than the height of the body. The height of the attachment members 15 is substantially half of the height of the body. The attachment members 15 are arranged such that bottoms of the attachment members 15 are flush with the bottom 3 of the body. Each attachment member 15 comprises four vertical corners. The vertical corners of the attachment members 15 are arranged in directions substantially parallel to the axis H. Two of the vertical corners of each attachment member 15 abut the body. All of the vertical corners of the attachment members 15 are rounded. The vertical corners of the attachment members 15 abut the body are rounded towards the its nearest corner of the body. Each attachment member 15 comprises a hole 15a. The holes 15a extend through its respective attachment member 15. The holes 15a extend through its respective attachment member 15 along a direction substantially parallel to the axis H. A first section of each hole 15a extends from the bottom of its respective attachment member 15 towards a top of its respective attachment member 15. A second section of each hole 15a extends from the first section of said hole 15a to the top of its respective attachment member 15. A diameter of each second section of each hole 15a is greater than a diameter of the respective first section of the respective hole 15a. Thereby, a ledge is formed inside each hole 15a. The holes 15a are configured for receiving fastening means. The fastening means may be configured to fasten the heatsink element 1 to another device and/or to a housing. The fastening means may comprise screws, bolts and/or nails. The attachment members 15 comprise a pin. The pin is configured to be inserted to a corresponding pin socket of the body of the heatsink element 1. The pin is secured by a rivet.

The heatsink element 1 comprises two passages 10. Each passage 10 extends through the body of the heatsink element 1. Each passage 10 comprises a first opening 13. The first openings 13 are arranged at the bottom 3 of the body. Each first opening 13 comprises a rectangular shape. Each first opening 13 comprises four sides. Each side of the first opening is substantially parallel to a respective side of the bottom 3 of the body. The first openings 13 are arranged at a center of the bottom 3 of the body with regards to the length of the body. Each first opening 13 is arranged at a distance from a center of the bottom 3 of the body with regards to the width of the body. Each passage 10 comprises a second opening 14. The second openings 14 are arranged along the top 11, 11a of the body, and along a part of the second sides 12b of the body.

Each passage 10 comprises four side surfaces 10a, 10b, which define the passage 10 in conjunction with the first and second openings 13, 14. Each side surface 10a, 10b extends from a respective side of the first opening 13 towards the second opening 14. Each side surface 10a, 10b is a flat surface. The four side surfaces 10a, 10b comprise two opposite first side surfaces 10a and two opposite second side surfaces 10b. Each first side surface 10a extends from the bottom 3, or the first opening 13, obliquely towards a respective first side 12a of the body and towards the top 11, 11a of the body. Each second side 10b extends in a direction towards a respective second side 12b of the body and towards the top 11, 11a of the body.

The direction of extension of each side 10a, 10b of each passage 10 is defined by a relation between a direction towards the respective side 12a, 12b of the body and a direction towards the top 11, 11a of the body, wherein the relation defines an angle. For example, a side 10a, 10b of the passage which solely extends in a direction towards a respective side 12a, 12b of the body may be understood as the angle being substantially zero. Further, a side 10*a*, 10*b* of the passage which solely extends in a direction towards the top 11, 11*a* of the body may be understood as the angle being substantially ninety degrees. Further, it may be understood that if the angle of extension of all sides of a passage is substantially ninety degrees, the first opening and the second opening of the passage would have substantially the same size. The first sides 10*a* of the passages 10 shown in FIG. 1 have angles of extension which are greater than angles of extension of the second sides 10*b* of the passages 10. The second sides 10*b* of the passages 10 extend such that the respective sides of the second openings 14 are arranged at the second sides 12*b* of the body. The respective sides of the second openings 14 are arranged at a height which is substantially equal to the height of the attachment members 15. However, the second sides 10*b* of the passages may extend such that they end at the top 11, 11*a*.

Each passage 10 may be understood as a horn antenna. Each horn antenna may be configured for a respective antenna element. The sides 10*a*, 10*b*, of the passage may be understood as sides of a horn antenna. The horn antenna comprises a flaring metal waveguide. The sides 10*a*, 10*b* of the passage 10 may comprise the flaring metal waveguide of the horn antenna.

A length of the second opening 14 is greater than a width of the second opening 14. The directions of extension of the sides 10*a*, 10*b* of the passages may be configured to increase the gain of a respective antenna element arranged at the respective first opening 13. The passage(s) 10 may provide a gradual transition structure which may enable the waves from a respective at least one antenna element, arranged at a first opening of said passage, to radiate more efficiently into space. The passage 10 may be understood as tapering out from the its first opening 13 to its second opening 14. The taper of the passage 10 may gradually change the impedance along a length of the passage 10, thereby allowing waves to radiate more efficiently into space. The passage 10 may minimize wave reflection. The passage 10 may project waves in a beam which is more narrow than if the passage 10 was not arranged at the respective at least one antenna element. The directions of extension of the sides 10*a*, 10*b* of the passages may be configured to allow beam steering of an antenna element arranged at the respective first opening 13.

The top 11, 11*a* of the body comprises two side sections 11 and a middle section 11*a*. The middle section 11*a* may be understood as a ridge. The ridge runs between the two passages. The side sections 11 and the middle section 11*a* has lengths equal to the length of the body. The two side sections 11 have substantially equal widths. The width of each side section 11 is greater than a width of the middle section 11*a*. However, it is to be understood that this is purely exemplary. For example, the middle section 11*a* could have a width greater than a width of each side section 11. Further, there may, for example, not be a middle section 11. In such an example, the second openings 14 of the passages 10 would share one side.

Figure 2:
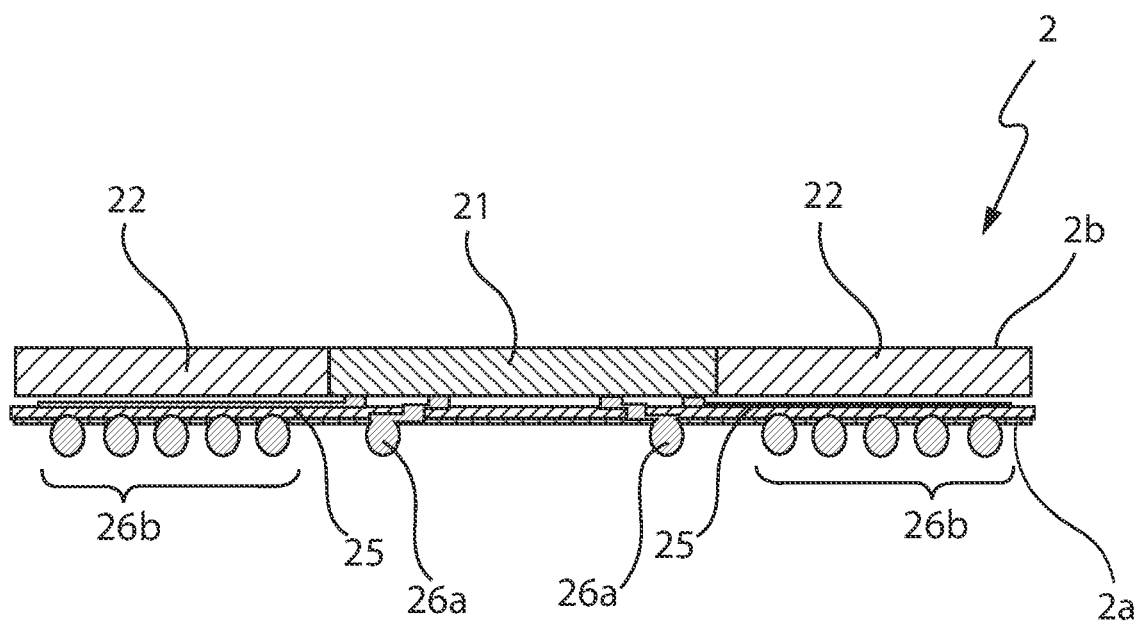
FIG. 2 schematically shows a cross-sectional view of an integrated circuit package according to an exemplifying embodiment of the present invention.

FIG. 2 schematically shows a cross-sectional view of an integrated circuit package 2 according to an exemplifying embodiment of the present invention. The integrated circuit package 2 comprises a first side 2*a* and second side 2*b*. The first side 2*a* and the second side 2*b* are opposite to each other. The integrated circuit package comprises two antenna elements 25. It is to be understood that each antenna element 25 may comprise a plurality of antennas and/or antenna arrays. The first side 2*a* comprises bumps 26*a*, 26*b*. The bumps 26*a*, 26*b* comprise interconnect elements 26*a*. Further, the bumps 26*a*, 26*b* comprise dummy bumps 26*b*. The integrated circuit package 2 comprises three passivation layers. The passivation layers extend along the length and width of the integrated circuit package 2. The integrated circuit package 2 comprises a die 21. One of the passivation layers comprise the first side 2*a*. The die 21 is arranged on top of the passivation layers, opposite the first side 2*a*. The integrated circuit package 2 comprises mold compound, comprising mold compound sections 22. The mold compound sections 22 are arranged at the sides of the die 21. The mold compound section(s) 22 are the part(s) of the mold compound comprising the at least one antenna element 25. The mold compound is arranged on top of the passivation layers, opposite to the first side 2*a* and around the die 21. A top of the die 21 is exposed. The mold compound does not cover the top of the die 21. However, it is to be understood that the mold compound may be arranged on top of the die 21 as well. The die 21 and the mold compound comprise the second side 2*b*. The integrated circuit package 2 comprises two redistribution layers. One of the redistribution layers connect the interconnect elements 26*a* to the die. The other redistribution layer comprises the two antenna elements 25. The redistribution layers are arranged between the passivation layers.

Figure 3:
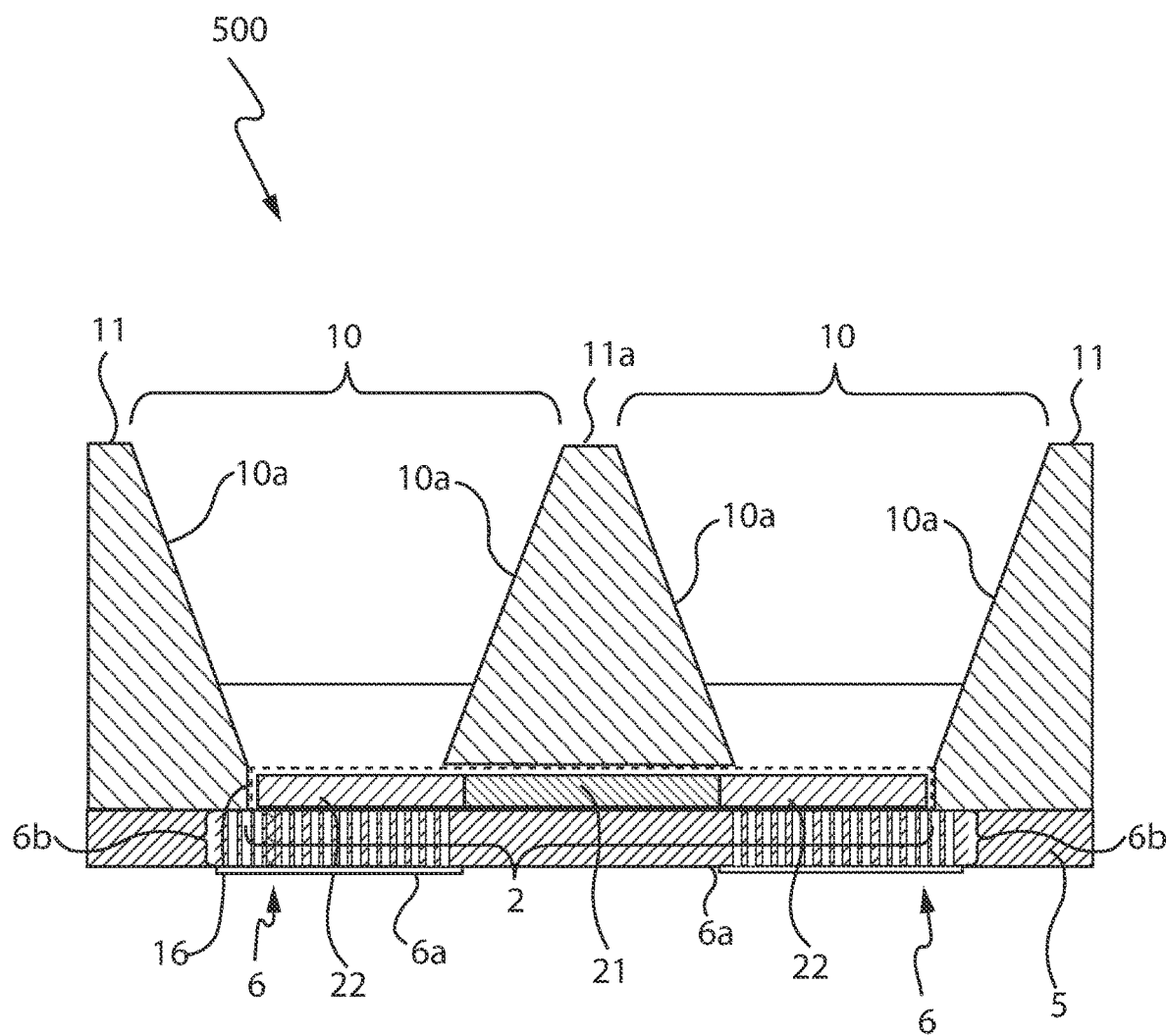
FIG. 3 schematically shows a cross-sectional view of a system according to an exemplifying embodiment of the present invention.

FIG. 3 schematically shows a cross-sectional view of a system 500 according to an exemplifying embodiment of the present invention. It should be noted that FIG. 3 comprises features, elements and/or functions as shown in FIGS. 1 and 2 and described in the associated texts. Hence, it is also referred to those figures and the descriptions relating thereto for an increased understanding. The system 500 comprises an arrangement 100 and a printed circuit board 5. The printed circuit board 5 comprises a first side and a second side. The arrangement 100 comprises an integrated circuit package 2 and a heatsink element 1. The arrangement 100 is placed on the second side of the printed circuit board 5. The arrangement 100 is placed on the second side of the printed circuit board 5 such that the first side 2*a* of the integrated circuit package 2 and the bottom of the heatsink element 1 is placed on the second side of the printed circuit board 5.

In FIG. 3, the heatsink element 1 is shown to be arranged around the integrated circuit package 2. The heatsink element 1, shown in FIG. 3, comprises a socket 16. The socket 16 is arranged at the bottom of the heatsink element 1. A size of the socket 16 is substantially equal to a size of the integrated circuit package 2. First openings 13 of the heatsink element 1 may be understood as being arranged in and/or at the socket 16. The bottom of the heatsink 1 may comprise a surface of the socket 16. The integrated circuit package 2 is arranged inside the socket 16 of the heatsink element 1 such that the first side 2*a* of the integrated circuit package 2 and a part of the bottom of the heatsink element 1 that surrounds the integrated circuit package 2 are substantially flush with each other. Another part of a bottom of the heatsink element 11 covers and/or abuts the die 21 of the integrated circuit package 2.

The cross-section in FIG. 3 shows a heatsink element 1 comprising two passages 10, each comprising two first sides 10*a*. The cross-sectional view in FIG. 3 does not show the second sides 10*b* (not shown; see e.g. FIG. 1) of the passages 10. However, it is to be understood that the passages 10 comprise second sides 10*b*. The first sides 10*a* of each passage are extending from a respective first opening 13 towards the top 11, 11*a* of the heatsink element 1. Each first opening 13 is arranged at a respective mold compound section 22. Each mold compound section 22 may comprise at least one antenna element 25.

The printed circuit board 5 comprises two reflector elements 6. Each reflector element 6 is arranged at a respective at least one antenna element 25. Each reflector element 6 is arranged with respect to a respective at least one antenna element 25 and a respective first opening 13. The reflector elements 6 may comprise a metal layer 6a. Each reflector element 6 may comprise a metal layer 6a. The metal layers 6a are arranged at a quarter wave distance from a respective at least one antenna element 25. The reflector elements 6 comprise vias 6b. The vias 6b of each reflector element 6 are arranged around in a shape having substantially the same shape as a respective mold compound section 22. The vias 6b may be understood as fencing.

Figure 4:
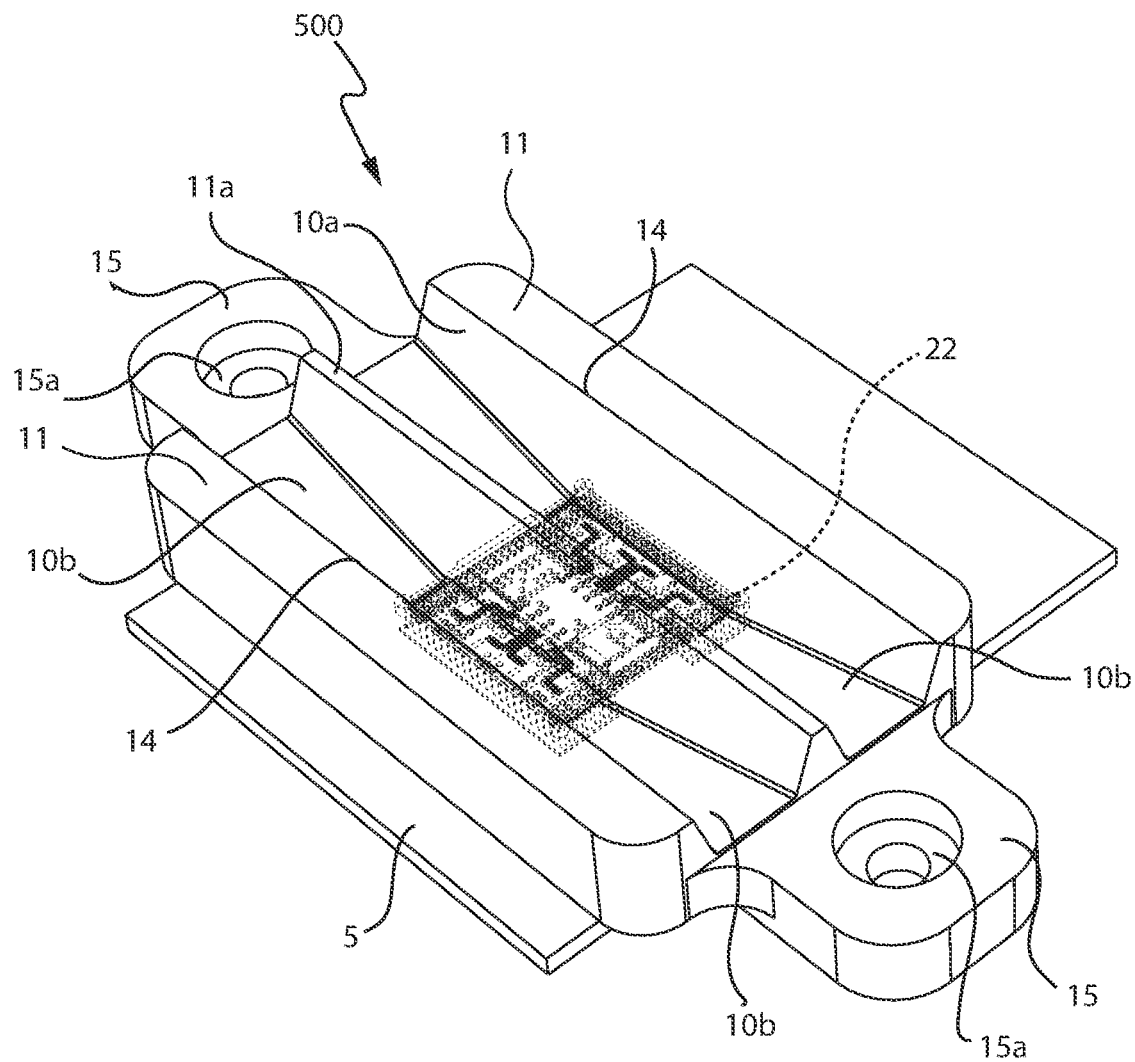
FIG. 4 schematically shows a perspective view of a system according to an exemplifying embodiment of the present invention.

FIG. 4 schematically shows a perspective view of a system 500 according to an exemplifying embodiment of the present invention. It should be noted that FIG. 4 comprises features, elements and/or functions as shown in FIGS. 1 to 3 and described in the associated texts. Hence, it is also referred to those figures and the descriptions relating thereto for an increased understanding. FIG. 4 shows a system 500. The system 500 comprises an arrangement 100 and a printed circuit board 5. The arrangement 100 comprises a heatsink element 1 and an integrated circuit package 2. The arrangement 100 is mounted to the printed circuit board 5. The perspective view of the system 500 shows the system 500 from above, wherein the top 11, 11a, of the heatsink element 1 can be seen. Further, FIG. 4 shows the fan-out areas 22 of the integrated circuit package 2 arranged at first openings 13 of the heatsink element 1. The passages 10 of the heatsink element 11 are shown to be extending from the first openings 13 towards the second openings 14. The second openings 14 extend along the top 11, 11a of the heatsink element 1 and along upper parts of the sides 12b (not shown; see e.g. FIG. 1). The arrangement 100 is mounted centrally on the printed circuit board 5. A width of the body of the heatsink element 1 is substantially equal to a width of the printed circuit board 5. The arrangement 100 is mounted to the printed circuit board 5 such that each first opening 13 and its respective fan-out area 22 are mounted on top of a reflector element 6 (not shown; see e.g. FIG. 3 or 5) of the printed circuit board 5. Attachment members 15 of the heatsink element 1 extend outside of the printed circuit board 5. The attachment members 15 may be configured to attach the system 500 to, for example, an auxiliary device, an auxiliary heatsink element, and/or a housing.

Figure 5:
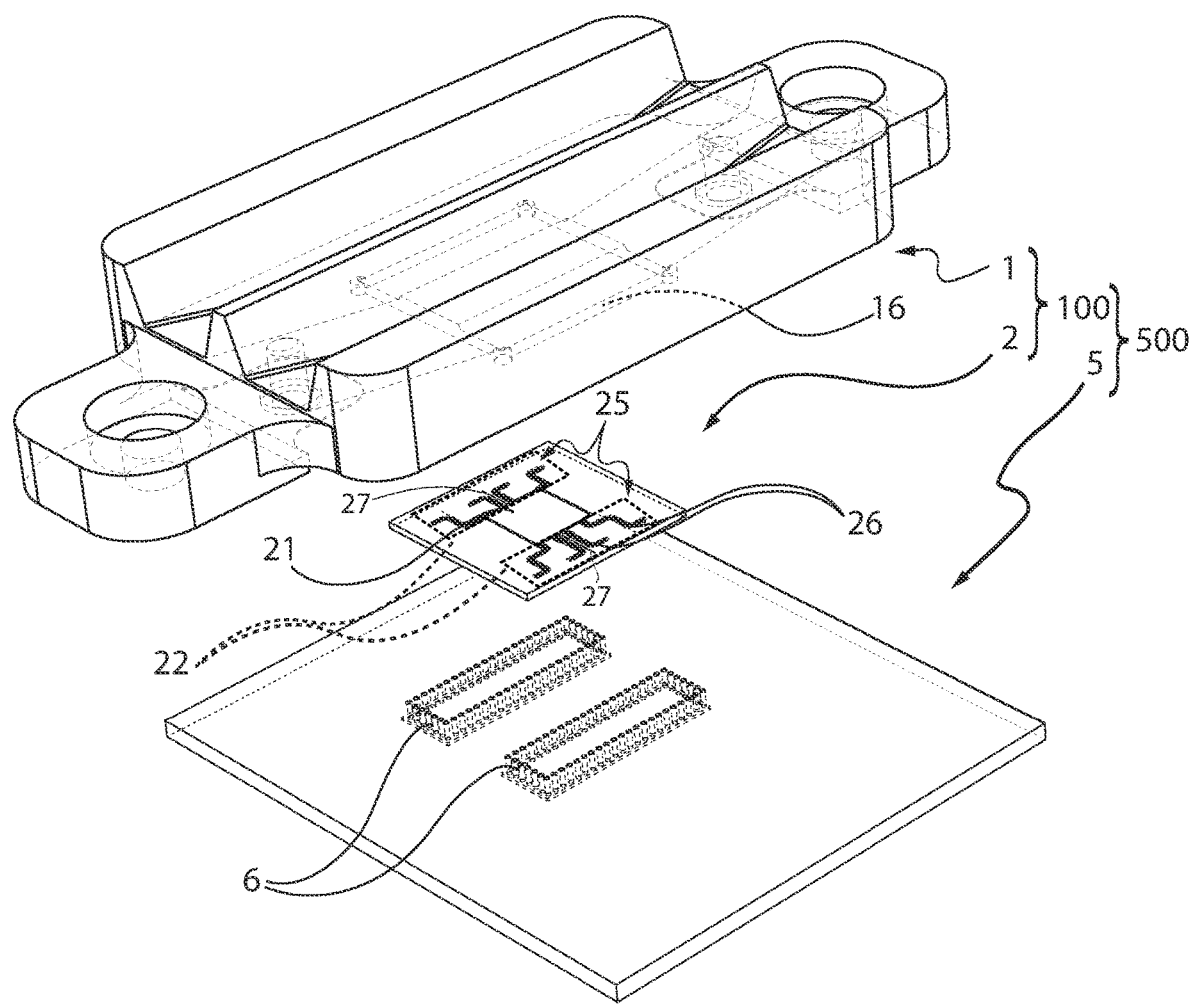
FIG. 5 schematically shows an exploded view of a system according to an exemplifying embodiment of the present invention.

FIG. 5 schematically shows an exploded view of a system 500 according to an exemplifying embodiment of the present invention. It should be noted that FIG. 5 comprises features, elements and/or functions as shown in FIGS. 1 to 4 and described in the associated texts. Hence, it is also referred to those figures and the descriptions relating thereto for an increased understanding. FIG. 5 shows a system 500. The system 500 comprises a heatsink element 1, an integrated circuit package 2 and a printed circuit board 5. The exploded view in FIG. 5 shows the heatsink 1 element arranged above the integrated circuit package 2, and the integrated circuit package 2 above the printed circuit board 5.

The heatsink 1 comprises a socket 16. The socket 16 is configured to receive the integrated circuit package 2. The integrated circuit package 2 comprises a die 21 and two fan-out areas 22. The fan-out areas 22 each comprises at least one antenna element. The integrated circuit package 2 is configured to be inserted into the socket 16 such that each fan-out area 22, comprising the at least one antenna element, is arranged at a respective first opening 13 of the heatsink element 1.

The integrated circuit package 2 shown in FIG. 5 comprises a die 21 and two antenna elements 25 arranged in a respective fan-out area 22. The die 21 comprises a transceiver chip. The die 21 has a rectangular shape. The die 21 is arranged at a center of the integrated circuit package 2. Sides of the die 21 are substantially parallel to sides of the integrated circuit package 2. Each of the two antenna elements 25 is coupled to a side of the die 21, wherein the two antenna elements 25 are coupled to opposite sides of the die 21. Each antenna element 25, shown in FIG. 5, comprises four dipole antennas 26. The four dipole antennas 26 of each antenna element 25 are aligned with each other. The four dipole antennas 26 of each antenna element 25 are arranged at an equal distance from adjacent dipole antennas 26 of the respective antenna element 25. Each antenna element 25 comprises an open-ended resonator strip 27 connected to ground. Each resonator strip 27 is arranged between the two dipole antennas 26 arranged in the middle of the four dipole antennas 26 of each antenna element 25. The resonator strip(s) 27 is (are) configured for decoupling the two dipole antennas 26 arranged in the middle of the four dipole antennas 26 of each antenna element 25. One of the two antenna elements 25 arranged in one of the two fan-out areas 22 is configured for receiving signals, while the other of the two antenna elements 25 arranged in the other fan-out area 22 is configured for transmitting signals. Areas of the integrated circuit package 2 which are between the fan-out areas 22 and adjacent to sides which the antenna elements 25 are not coupled to comprise signal and/or ground routing (not shown). The signal and/or ground routing is configured for decoupling the two antenna elements 25.

The printed circuit board 5 comprises two reflector elements 6. The heatsink element 1 and the integrated circuit package 2 are configured to be mounted to the printed circuit board 5 such that each first openings 13 of the heatsink element 1 and a respective fan-out area 22, comprising at least one antenna element 25, of the printed circuit board 2 are arranged above a respective reflector element 6.

The person skilled in the art realizes that the present invention by no means is limited to the preferred embodiments described above. On the contrary, many modifications and variations are possible within the scope of the appended claims.

The invention claimed is:

1. A system comprising:
   an integrated circuit package comprising, on a first side, interconnect elements and at least one antenna; and
   a heatsink arranged on a second side of the integrated circuit package opposite to the first side, the heatsink comprising at least one passage extending through the heatsink, the at least one passage having an opening disposed over the antenna;
   wherein the passage is configured to increase the gain of the antenna.

2. The system of claim 1, wherein integrated circuit package has two antennas.

3. The system of claim 1, wherein integrated circuit package comprises a die portion and a first fan-out portion.

4. The system of claim 3, wherein the antenna is disposed in the first fan-out portion.

5. The system of claim 3, further comprising a second fan-out portion spaced apart from the first fan-out portion.

6. The system of claim 5, wherein integrated circuit package has two antennas.

7. The system of claim 6, wherein a receiving antenna is disposed in the first fan-out portion and a transmitting antenna is disposed in the second fan-out portion.

8. The system of claim 1, wherein the antenna comprises a receiving antenna and a transmitting antenna.

9. The system of claim 1, wherein the antenna comprises a dipole antenna.

10. The system of claim 1, wherein the integrated circuit package further comprises an embedded level ball grid array package.

11. The system of claim 1, wherein the passage is configured as a horn antenna.

12. The system of claim 1, further comprising a printed circuit board engaging the first side of the integrated circuit package.

13. The system of claim 12, wherein the printed circuit board comprises a reflector.

14. The system of claim 13, wherein the reflector is aligned with the antenna.

15. A heatsink for engaging an integrated circuit package comprising at least one antenna, the heatsink comprising:

a socket recessed into a bottom of the heatsink for receiving the integrated circuit package;

a first opening disposed adjacent to the antenna and extending from the socket to at least one passage extending through the heatsink, the passage terminating in a second opening of the heatsink;

wherein the passage is configured to increase the gain of the antenna.

16. The heatsink of claim 15, wherein the second opening is arranged at least in part at a top of the heatsink.

17. The heatsink of claim 15, wherein the second opening is arranged at least in part at a side of the heatsink.

18. The heatsink of claim 15, wherein the second opening is larger than the first opening.

19. The heatsink of claim 15, wherein the passage is configured as a horn antenna.

20. The heatsink of claim 15, further comprising a pair of attachment members extending on opposite sides of the heatsink, wherein bottoms of the attachment members are flush with the bottom of the heatsink.

* * * * *